United States Patent [19]
Zandonatti
[11] 3,753,290
[45] Aug. 21, 1973

[54] ELECTRICAL CONNECTION MEMBERS FOR ELECTRONIC DEVICES AND METHOD OF MAKING SAME

[75] Inventor: Raymond A. Zandonatti, Beaverton, Oreg.
[73] Assignee: Tektronix, Inc., Beaverton, Oreg.

[22] Filed: Sept. 30, 1971
[21] Appl. No.: 185,260

[52] U.S. Cl. .......................... 29/628, 29/625, 29/627
[51] Int. Cl. .......................... H01r 43/00
[58] Field of Search .......................... 29/625, 626, 627, 29/589, 590, 591, 628; 317/101, 234; 174/DIG. 3

[56] References Cited

UNITED STATES PATENTS

| | | | |
|---|---|---|---|
| 2,890,395 | 6/1959 | Lathop et al. | 29/591 X |
| 3,235,945 | 2/1966 | Hall, Jr. et al. | 29/591 X |
| 3,307,239 | 3/1967 | Lepselter et al. | 29/591 |
| 3,325,882 | 6/1967 | Chow | 29/591 |
| 3,487,541 | 1/1970 | Boswell | 29/626 |
| 3,471,923 | 10/1969 | Lamorte et al. | 29/590 X |
| 3,348,299 | 10/1967 | Knutson | 29/590 X |

*Primary Examiner*—Charles W. Lanham
*Assistant Examiner*—James R. Duzan
*Attorney*—Adrian J. La Rue et al.

[57] ABSTRACT

Electrical connection means are formed on surface means of an electronic device. One end of the electrical connection means is connected to electrical contact means provided by the electronic device. The free end of the electrical connection means is engaged and lifted from the surface means thereby lifting at least a section of the electrical connection means free of the surface means and the free end is electrically connected to another electrical contact means.

5 Claims, 4 Drawing Figures

INVENTOR:
RAYMOND A. ZANDONATTI
BY: Adrian J. LaRue
ATTORNEY

INVENTOR:

RAYMOND A ZANDONATTI

BY: Adrian J. LaRue

ATTORNEY

ELECTRICAL CONNECTION MEMBERS FOR ELECTRONIC DEVICES AND METHOD OF MAKING SAME

BACKGROUND OF THE INVENTION

The subject matter of the present invention relates generally to electrical connection members for semiconductor or solid state devices which uses a material for movements of electrons therein by the application of electric fields thereto such as, for example, diodes, transistors, integrated circuits, hybrid solid state circuits, and resistive and other solid state members, a method of making semiconductor devices having such electrical connection members and a method of making electrical connections of the electrical connection members.

A number of semiconductor electrical connections is known and one of these is identified as a thermocompression or diffusion bonding technique wherein heat and pressure are used causing typically gold or aluminum wires to adhere to device metalization. This technique has certain disadvantages among which is that high temperatures in the order of 300° C. and high pressures are used which may damage the semiconductor or solid state devices or junctions thereof when they are raised to this high temperature and subjected to such high pressure. Another disadvantage in using this technique is that, since the wire is mechanically handled, the smallest feasible connection area is typically a 1 mil square island.

Another approach is ultrasonic bonding whereby vibratory energy is used to scrub a gold or aluminum wire against a metalized area of the solid state device until a weld is created. This approach can only be used with respect to select metals which lend themselves to ultrasonic welding and the same size disadvantage as stated hereinabove makes such a connection undesirable.

A further technique is that of a flip chip or bump approach by which various means such as, for example, sputtering or plating, is utilized to provide hemispherically-shaped bumps on metalized areas of an electronic device; the device is then inverted and electrically connected to a header by soldering or welding the bumps thereto. One drawback of an inverted device is that it does not dissipate heat as well as one which is die-attached right side up. Another drawback is that the bumps are usually about three mils in diameter thus causing added junction capacitance.

An additional approach is the beam lead technique whereby beam-shaped members are formed via sputtering or plating on metalized areas of an electronic device. After the wafer is separated into individual chips, the beams extend outwardly beyond the confines of the device, the device is inverted and then attached to a header by soldering or welding the beams thereto. One disadvantage of this technique is that it suffers poor power dissipation. Another disadvantage is that the beams are about 2 mils wide and extend onto the device about 5 mils thus providing added junction capacitance. A further disadvantage is that expensive deposition and wafer separation processes are required.

Various other techniques are used to provide electrical connection members on solid state devices which are known in the field as flexible beam lead bonding, spider bonding and bumped substrate bonding, but these techniques have one thing in common which is they require a 3 mil square or larger bonding pad on the device as a major drawback and this adds junction capacitance.

An object of the present invention is to provide a solid state device having formed thereon electrical connection members which has portions that are peeled away from a surface and electrically connected to a conductive member.

Another object of the present invention is the provision of forming electrical connection members on solid state devices which are provided with portions that are peelable away from a surface thereof.

A further object of the present invention is to provide electrical connection members on solid state devices which permit very small connections to be made thereby reducing the capacitance.

An additional object of the present invention is the provision of an electronic device of solid state configuration on which electrical connection members are formed which have portions that are peelable away from a surface thereof for electrical connection to a conductive member on the electronic device or on a header.

A still further object of the present invention is to provide a method of making a solid state device having electrical connection members provided with peelable sections.

Still an additional object of the present invention is the provision of a method of making electrical connections between peelable sections of electrical connection members on solid state devices and electrical conductive members on the solid state devices or remote therefrom.

BRIEF DESCRIPTION OF DRAWINGS

Other objects and advantages of the present invention will be apparent from the following detailed description of preferred embodiments thereof and from the attached drawings of which.

DETAILED DESCRIPTION OF PREFERRED EMBODIMENT

The present invention is described in conjunction with the formation of an aluminum Schottky diode semiconductor device which is provided with the electrical connection members having peelable sections, but it is to be understood that the present invention can be used on any solid state device.

Figure 1:
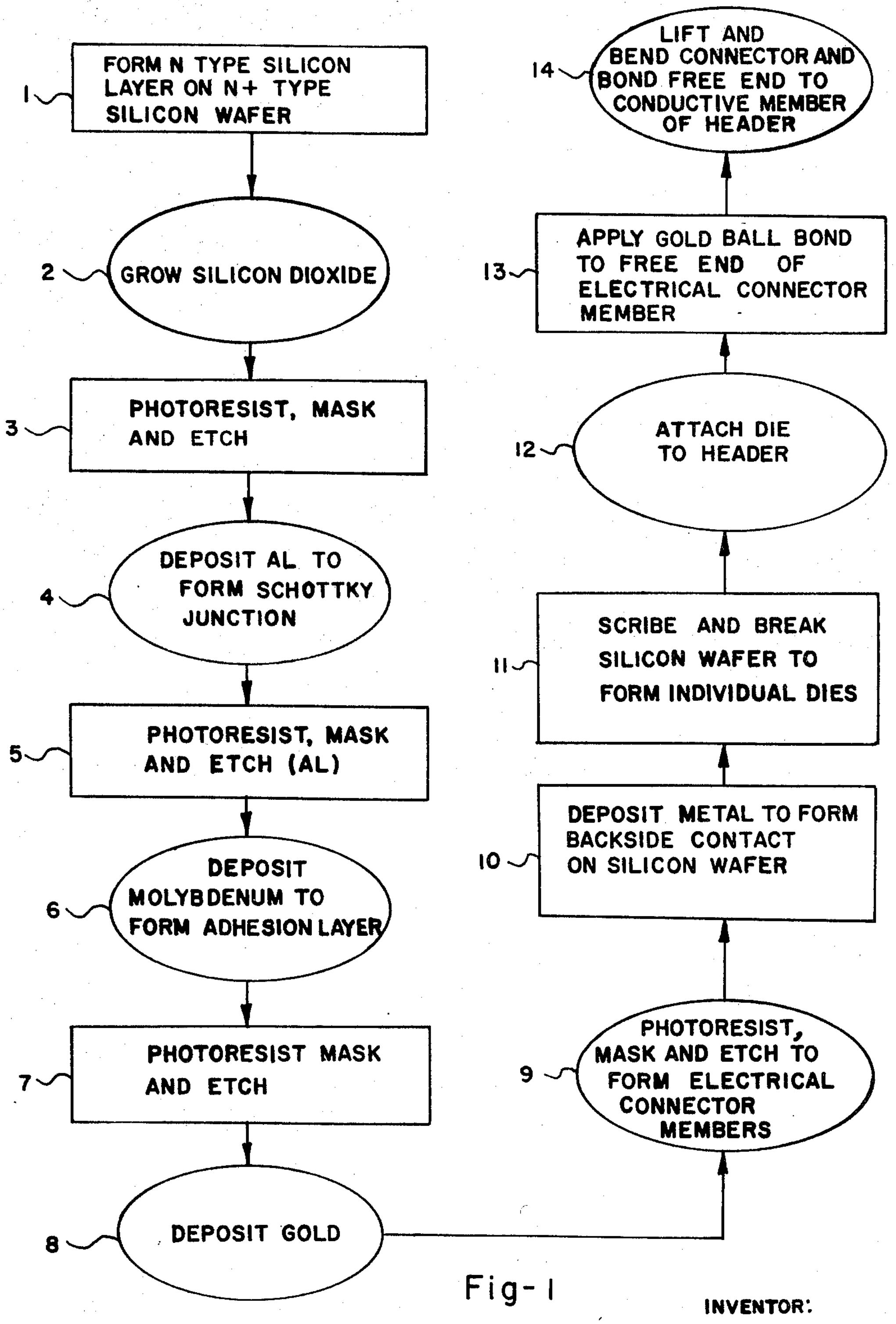
FIG. 1 is a block diagram of the steps in a method of manufacture of a Schottky diode in accordance with the present invention.
Figures 2, 3, 4:
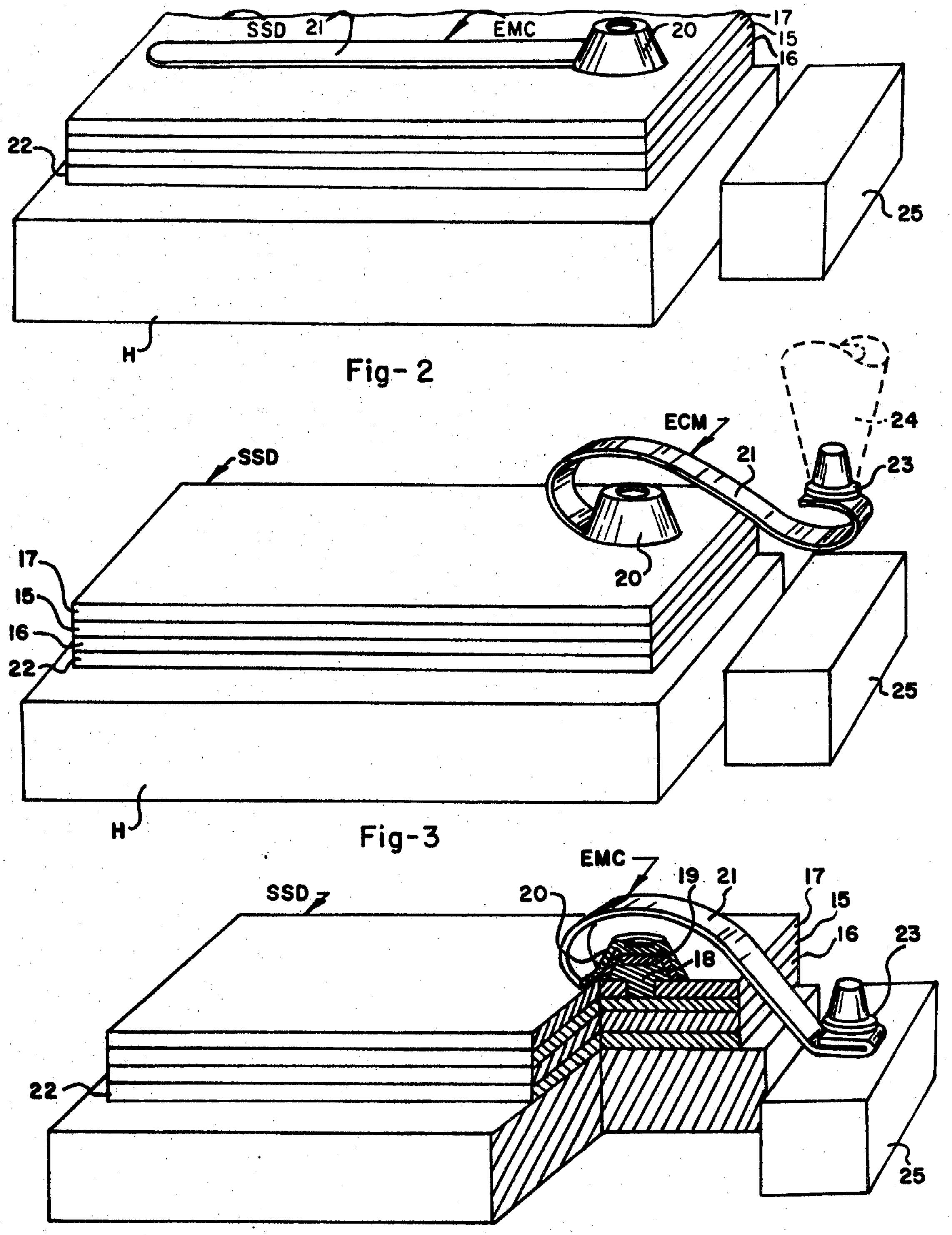
FIG. 2 is a perspective view of a solid state device with an electrical connection member in a non-connection position.
FIG. 3 is a view similar to FIG. 2 illustrating a peelable section of the electrical connection member peeled away from a surface of the solid state device and positioned for connection to a conductive member.
FIG. 4 is a view similar to FIGS. 2 and 3 with the electrical connection made and a part cross-sectional view of the solid state device and header.

Turning to FIGS. 1 and 4, the method of the present invention includes a first step 1 in which a thin layer of N type silicon 15 is formed on an N+ type silicon wafer 16 in a conventional manner such as by epitaxial growth. Next step 2 is performed whereby silicon dioxide 17 is thermally or pyrolytically grown on the silicon 15. Step 3 is directed to photoresist, masking and etching of the silicon dioxide layer 17 in accordance with conventional practice to provide a mask for the diffusion of a deposit of a metal layer. In step 4, a metal, such as aluminum, is deposited by vapor deposition to form a Schottky junction, and step 5 comprises a second photoresist, masking and etching of the aluminum to remove excess aluminum in accordance with conventional techniques and leaving junction 18. Steps 1 – 5 therefore disclose the method of making a conventional Schottky diode.

Step 6 is performed to deposit molybdenum on the aluminum junction 18 and the silicon dioxide layer 17 to form an adhesion layer. A third photoresist, masking and etching step 7 is then performed to remove excess molybdenum and leave molybdenum 19 coating junction 18. Step 8 is directed to the deposition of a suitable metal, which is preferably gold, as a thin layer onto the molybdenum and silicon dioxide layer; the molybdenum providing excellent adhesion characteristics so that gold in engagement with the molybdenum is maintained in electrical engagement with junction 18. Step 9 concerns the fourth photoresist, masking and etching to form electrical connection member or means ECM including contact section 20 in adhering engagement with junction 18 via molybdenum coating 19 and peelable section 21. In step 10, metal 22 is deposited on the bottom surface of silicon wafer 16 to form a back-side contact on silicon wafer 16; the metal is preferably gold, but it can be a nickel-gold alloy or the like. Thus, solid state device SSD is completed.

The above-described steps describe a silicon wafer on which a number of solid state devices, which in the present case have been described as Schottky diodes, have been formed in accordance with conventional solid state manufacturing techniques except for the formation of electrical connection members ECM. Thus, step 11 is performed to scribe and break the silicon wafer to form individual dies or discrete solid state devices SSD. The die or solid state device SSD is then in accordance with step 12 attached by soldering or welding to a header H, which may be either metal or a dielectric member having conductive areas thereon.

A ball-shaped member 23 generally of gold is bonded preferably by welding to a free end of peelable section 21 of electrical connection member ECM according to step 13, and step 14 is performed whereby peelable section 21 is peeled away from the surface of silicon dioxide 17 by lifting member 23 via electrode 24, section 21 is bent and the free end of section 21 is bonded via welding to electrical conductive member 25 which can be part of header H or a separate member thereby effecting an electrical connection. The electrical connection member may be electrically connected to another conductive area on the solid state device or to a conductive area on another solid state device.

The electrical connection member is constructed such that one section is made to adhere to a selected or selected areas of the electronic or solid state device and another section does not adhere to the electronic or solid state device; this other section is capable of being peeled or lifted off of the surface of the electronic or solid state device along which it extends and electrically connected to a conductive member.

The basic structure of the device may be silicon, germanium, gallium arsenide, gallium arsenide phosphide, quartz glass or ceramic and the surface on which the peelable section or sections of the electrical connection means is or are not made to adhere may be silicon, dioxide, silicon nitride, glass or the like. The area or areas on which the section or sections of the electrical connection means is or are made to adhere may be of a material that is not part of the basic material of the device but rather an additional material which is added onto selected areas of the device and this material may be molybdenum, aluminum, platinum, platinum silicide or the like. The electrical connection means may be of metal or any other material capable of carrying electrical signals or current and having mechanical support.

The use of electrical connection means ECM allows very small connections to be made in the order of 0.0003 inches in diameter; whereas present art devices make connections of approximately 0.001 inches in diameter. Small connections provide a greater degree of high speed operation; they eliminate or minimize to a great extent the inductance problem associated with the general use of fine wire since the peeled-back section of the electrical connection means can be, if desired, quite wide in all areas that are not connected directly to the electronic device. Thus, peelable section 21 can take many forms in order to comply with essential design configurations. Electrical probing onto the peelable section 21 to attach gold ball 23 or to attach some other member onto the free end of section 21 is made easier since section 21 in its non-peeled condition presents a large target for attaching ball 23 or the like. Operator dependency to make the electrical connection is reduced so that effective electrical connections can be made with less dependency on skill. Low capacitance electrical connections are made by use of the present electrical connection means as a result of the smallness of the connection area that is made between the free end of the peelable section 21 to its connection area after the peelable section 21 has been peeled away from the surface of the electronic device.

While there has been shown and described a preferred embodiment of the present invention, it will be apparent to those skilled in the art that many changes and modifications may be made without departing from the broader aspects of my invention; therefore, it is intended that the appended claims cover all such changes and modifications as fall within the true spirit and scope of the present invention.

The invention is claimed in accordance with the following:

1. A method of forming an electrical connection member on a semi-conductor device and connecting one end thereof to an electrical conductive member comprising the steps of:
   - fabricating a junction member in said semiconductor device;
   - depositing a layer of metal onto said semiconductor device with a portion of the metal layer adhering to and electrically connected to said junction member;
   - applying photoresist onto said metal layer;
   - masking said photoresist thereby outlining an electrical connection member including said junction and a peelable section extending outwardly therefrom along said semiconductor device;
   - etching said photoresist in its unmasked section thereby leaving said electrical connection member and junction;
   - engaging an outer end of said peelable section;

lifting said outer end thereby peeling said peelable section from said semiconductor device;

bending said peelable section back across said junction; and connecting said outer end to said electrical conductive means.

2. The method of claim 1 wherein said junction has thereon a deposit of metal to form a metal adhesion layer for said electrical connection member.

3. A method according to claim 2 wherein said layer of metal adhering material is selected from the group consisting of molybdenum, titanium, aluminum, platinum, and platinum silicide.

4. A method according to claim 1 wherein said layer of metal is gold.

5. A method according to claim 1 wherein said electrical connection member comprises a plurality thereof.

* * * * *